(12) United States Patent
Yamamoto

(10) Patent No.: US 7,190,414 B2
(45) Date of Patent: Mar. 13, 2007

(54) INPUT CIRCUIT OF TELEVISION TUNER IN WHICH INTERFERENCE CAUSED BY FM BROADCASTING SIGNAL IS ATTENUATED

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 423 days.

(21) Appl. No.: 10/811,698

(22) Filed: Mar. 29, 2004

(65) Prior Publication Data
US 2004/0201783 A1 Oct. 14, 2004

(30) Foreign Application Priority Data
Apr. 9, 2003 (JP) ............................. 2003-001953

(51) Int. Cl.
*H04N 5/46* (2006.01)
*H04N 5/50* (2006.01)
(52) U.S. Cl. ...................... 348/729; 348/731; 348/725
(58) Field of Classification Search ................ 348/729, 348/731, 725, 733; 455/179.1, 182.3; *H04N 5/44, H04N 5/46, 5/50*
See application file for complete search history.

(56) References Cited

U.S. PATENT DOCUMENTS

| | | | | |
|---|---|---|---|---|
| 6,342,928 B1 * | 1/2002 | Ohira | ......................... | 348/729 |
| 6,344,881 B1 * | 2/2002 | Endo | ......................... | 348/729 |
| 6,351,294 B1 * | 2/2002 | Yamamoto et al. | ......... | 348/731 |
| 6,914,639 B2 * | 7/2005 | Yamamoto et al. | ......... | 348/731 |

FOREIGN PATENT DOCUMENTS

JP 11-008562 1/1999

* cited by examiner

*Primary Examiner*—Trang U. Tran
(74) *Attorney, Agent, or Firm*—Brinks Hofer Gilson & Lione

(57) ABSTRACT

An object of the present invention is to switch a television signal or an FM broadcasting signal by a small number of active elements, to input the switched television signal or FM broadcasting signal to an input tuning circuit, to reduce loss in the television signal when the television signal is received, and to reduce interference due to the FM broadcasting signal when the television signal is received.

According to the present invention, an the first input terminal 1 is connected to the input end 6a of the input tuning circuit 6, first and second diodes 15 and 14 are serially connected between the second input terminal 11 and the input end 6a of the input tuning circuit 6 and are simultaneously switched on or off, the first diode 15 is input to the input end 6a of the input tuning circuit 6, the second diode 14 is provided at the side of the second input terminal 11, an inductance element 12 is interposed between the second input terminal 11 and the second diode 14, and a first capacitance element 17 that forms a low pass filter together with the inductance element 12 in a state when the second diode 14 is switched on, is connected between the connection point of the first diode 15 and the second diode 14 and a ground.

3 Claims, 2 Drawing Sheets

INPUT CIRCUIT OF TELEVISION TUNER IN WHICH INTERFERENCE CAUSED BY FM BROADCASTING SIGNAL IS ATTENUATED

This application claims the benefit of priority to Japanese Patent Application No. 2003-001953, herein incorporated by reference.

BACKGROUND OF THE INVENTION

1. Field of the Invention

The present invention relates to an input circuit of a television tuner.

2. Description of the Related Art

An input circuit of a conventional television tuner will be described with reference to FIG. 2. A first terminal 51 to which a television signal is input is shunted by a CB trap 52 for attenuating a CB band and is connected to an input tuning circuit 57 sequentially through an intermediate frequency (IF) trap circuit 53 for attenuating an intermediate frequency band, a frequency modulation (FM) trap circuit 54 for attenuating an FM broadcasting band, and first and second diodes 55 and 56 which are connected in series each other. The cathodes of the first and second diodes 55 and 56 are connected to each other. The first diode 55 is provided at the side of the first input terminal 51. The second diode is provided at the side of the input tuning circuit 57. The input tuning circuit 57 is switched by a diode 57a so as to be tuned to a low band and a high band of VHF bands.

On the other hand, a second terminal 61 to which an FM broadcasting signal is input is connected to the input tuning circuit 57 through an inductance element 62 and third and fourth diodes 63 and 64 serially connected to each other. The cathodes of the third and fourth diodes 63 and 64 are connected to each other. The third diode 63 is provided on the second input terminal 61. The fourth diode 64 is provided at the side of the input tuning circuit 57. The anode of the fourth diode 64 is connected to the anode of the second diode 56.

A bias voltage from a voltage dividing circuit 60 for dividing a power supply voltage B is independently applied to each of the anodes and cathodes of the first through fourth diodes 55, 56, 63, and 64.

The anode of a fifth diode 58 is connected to the anode of the first diode 55. The cathode of the fifth diode is connected to the collector of a first transistor 70. The emitter of the first transistor 70 is grounded. The bias voltage from the voltage dividing circuit 60 is applied to the collector of the first transistor. The cathodes of the third and fourth diodes are also connected to the collector of the first transistor 70. Furthermore, the anode of a varactor diode 65 is connected to the anode of the third diode 63. The cathode of the varactor diode is connected to the collector of a second transistor 71. The emitter of the second transistor 71 is grounded. The bias voltage from the voltage dividing circuit 60 is applied to the collector of the second transistor. A base is connected to the collector of the first transistor 70. The collectors of the first and second transistors 70 and 71 are high-frequency grounded by direct current cut capacitors 72 and 73, respectively.

In the above-mentioned structure, when the first transistor 70 is switched on, the second transistor 71 is switched off. Therefore, the first and second diodes 55 and 56 and the varactor diode 65 are switched off and the third and fourth diodes 63 and 64 and the fifth diode 58 are switched on. Therefore, only the FM broadcasting signal input to the second input terminal 61 is input to the input tuning circuit 57. In this case, the inductance element 62 and the varactor diode 65 may form a low pass filter.

On the other hand, when the first transistor is switched off, the second transistor 71 is switched on. Thereby, the first and second diodes 55 and 56 and the varactor diode 65 are switched on and the third and fourth diodes 63 and 64 and the fifth diode 58 are switched off. Therefore, only the television signal input to the first input terminal 51 is input to the input tuning circuit 57.

In the above-mentioned conventional structure, in order to switch the television signal or the FM broadcasting signal and to input the switched television signal or FM broadcasting signal to the input tuning circuit, a plurality of active elements (five diodes, one varactor diode, and two transistors) is used, thus increasing the cost. Also, in the case of receiving a television broadcasting which is accompanied by a video signal rather than the case of receiving FM broadcasting which is accompanied by only voice, NF (noise factor) is electrically required. Nevertheless, since the television signal is input to the input tuning circuit through the two diodes, the NF deteriorates due to loss in the television signal caused by the diodes.

Also, when receiving the television broadcasting, since it is not possible to completely block the FM broadcasting signal between the first input terminal and the input tuning circuit by the inter-terminal capacitance of the diode in which it is necessary to block the FM broadcasting signal, the FM broadcasting signal overlaps and interferes with the television signal.

SUMMARY OF THE INVENTION

It is an object of the present invention to switch a television signal or an FM broadcasting signal by a small number of active elements, to input the switched television signal or FM broadcasting signal to an input tuning circuit, to reduce loss in the television signal when the television signal is received, and to reduce interference due to the FM broadcasting signal when the television signal is received.

To achieve the above object, the present invention provides an input circuit of a television tuner, comprising a first input terminal to which a television signal is input; a second input terminal to which an FM broadcasting signal is input; an input tuning circuit tuned to the television signal and the FM broadcasting signal, wherein the first input terminal is connected to the input end of the input tuning circuit; first and second diodes serially connected between the second input terminal and the input end of the input tuning circuit and simultaneously switched on or off, wherein the first diode is input to the input end of the input tuning circuit, and wherein the second diode is provided at the side of the second input terminal; an inductance element interposed between the second input terminal and the second diode; and a first capacitance element that forms a low pass filter together with the inductance element in a state when the second diode is switched on and is connected between the connection point of the first diode and the second diode and a ground.

The input circuit of the television tuner according to the present invention further comprises a third diode that is switched on or off simultaneously with first and second switches and is interposed between the inductance element and the second diode; and a second capacitance element that forms a low pass filter together with the inductance element and the first capacitance element in a state when the second and third diodes are switched on and is connected between the connection point of the second diode and the third diode and the ground.

The input circuit of the television tuner according to the present invention further comprises an FM trap circuit provided between the first input terminal and the input end of the input tuning circuit for attenuating an FM broadcasting band; and a fourth diode connected between the connection point of the first diode and the second diode and the input end of the FM trap circuit, wherein the fourth diode is switched on or off simultaneously with the first through third diodes.

The input circuit of the television tuner according to the present invention further comprises a transistor whose emitter is grounded and whose collector is pulled up to a power supply voltage by a feed resistor, wherein the cathodes of the first, second, and fourth diodes are connected to each other, wherein the anodes of the second and third diodes are connected to each other, wherein a bias voltage lower than the power supply voltage is supplied to the anodes of the first through fourth diodes, wherein the cathodes of the first, second, and fourth diodes are connected to the collector of the transistor through a common first resistor, wherein the cathode of the third diode is connected to the collector of the transistor through a second resistor, and wherein the transistor is switched on or off.

REFERENCE NUMERALS

1: FIRST INPUT TERMINAL
2: CB TRAP CIRCUIT
3: IF TRAP CIRCUIT
4: FM TRAP CIRCUIT
5: COUPLING CAPACITANCE ELEMENT
6: INPUT TUNING CIRCUIT
6a: INPUT END
6b: DIODE
6c, 6d: INDUCTANCE ELEMENT
7: RESISTOR
11: SECOND INPUT TERMINAL
12: INDUCTANCE ELEMENT
13: THIRD DIODE
14: SECOND DIODE
15: FIRST DIODE
16: FOURTH DIODE
17: FIRST CAPACITANCE ELEMENT
18: SECOND CAPACITANCE ELEMENT
21: VOLTAGE DIVIDING CIRCUIT
22: FEED RESISTOR
23: TRANSISTOR
24, 25, 26: RESISTOR

DESCRIPTION OF THE PREFERRED EMBODIMENT

Figure 1:
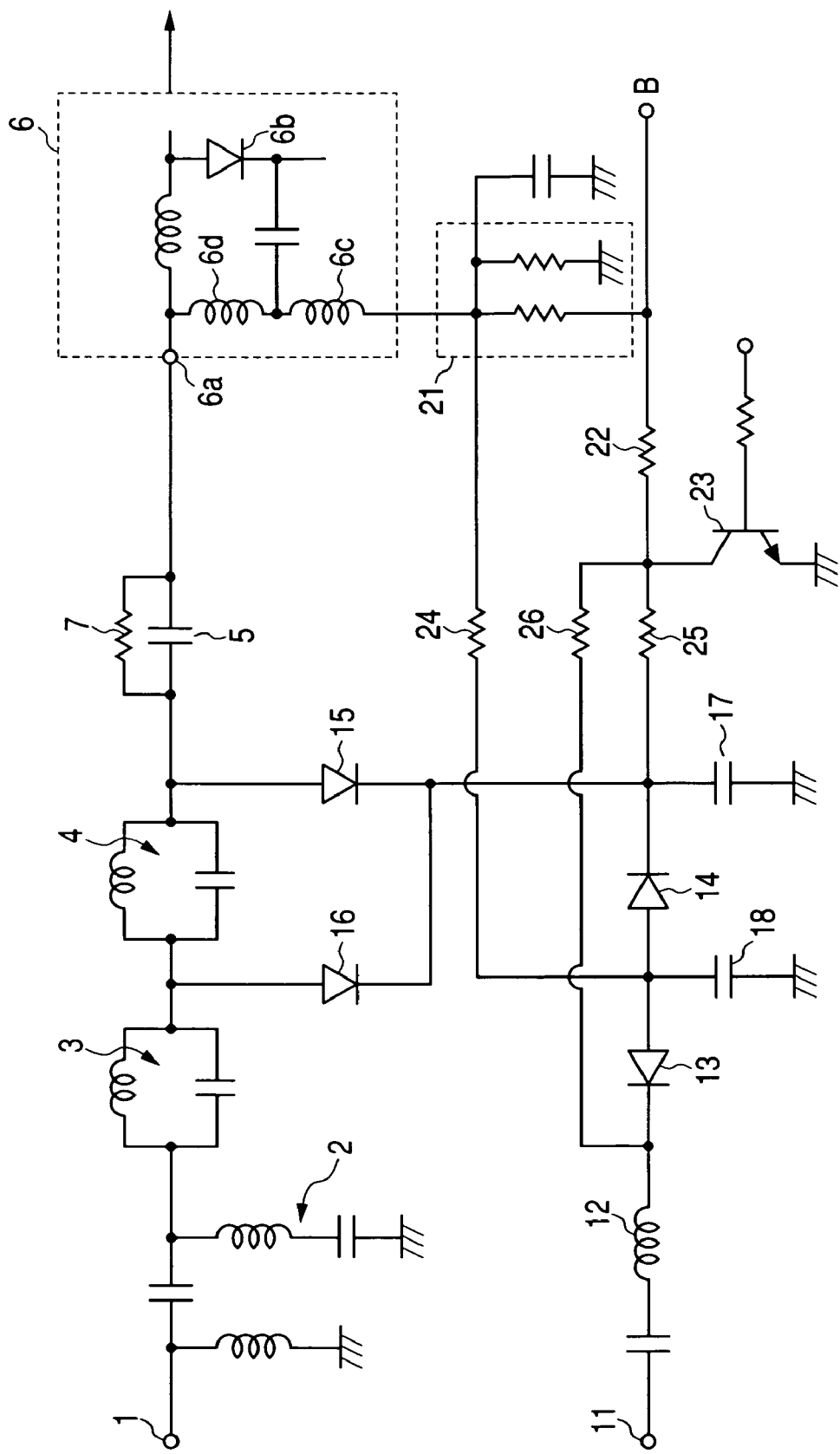
FIG. 1 is a circuit diagram illustrating the structure of an input circuit of a television tuner according to the present invention.
Figure 2:
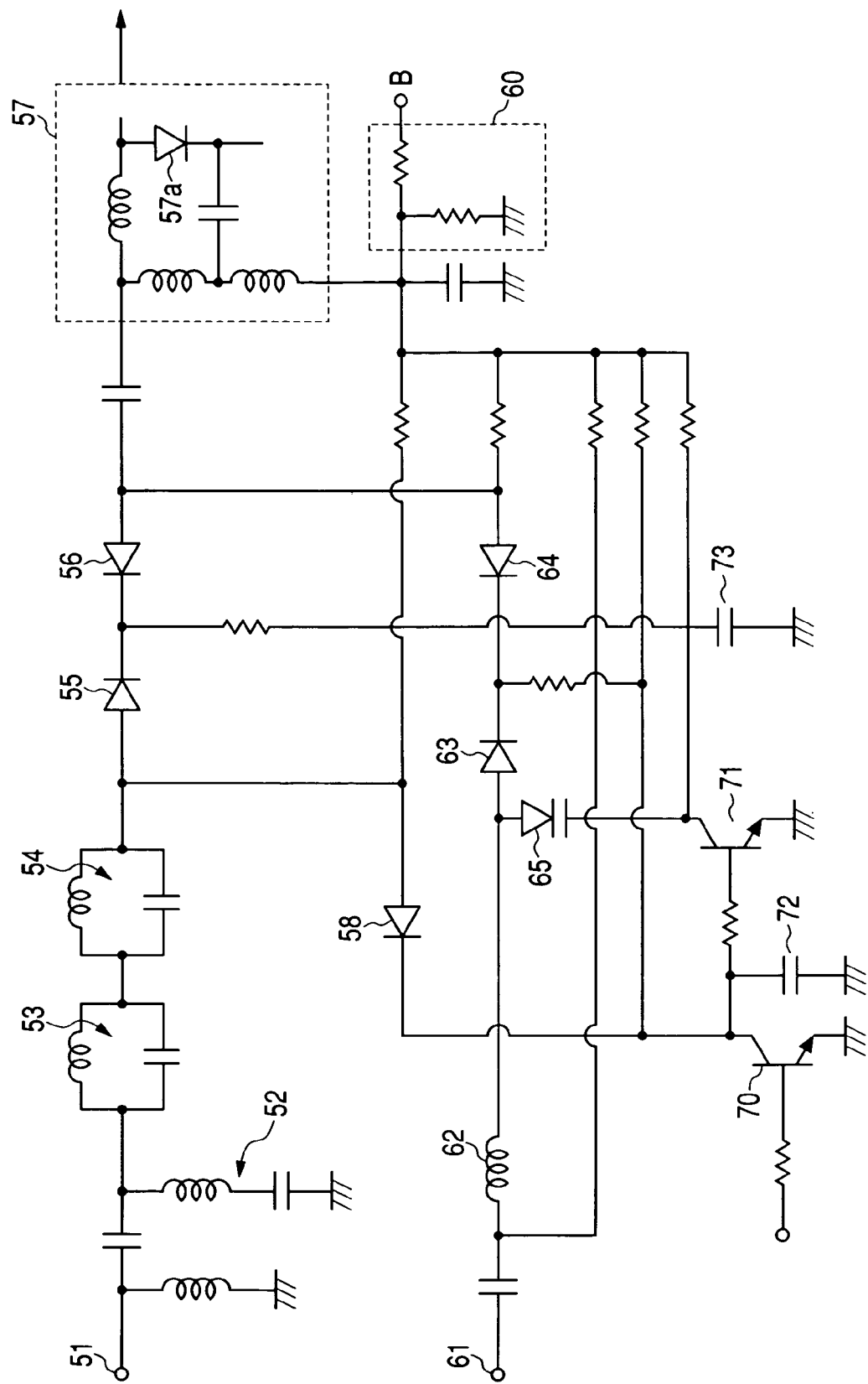
FIG. 2 is a circuit diagram illustrating the structure of an input circuit of a conventional television tuner.

FIG. 1 illustrates an input circuit of a television tuner according to the present invention. In FIG. 1, a first terminal 1 to which a television signal is input is shunted by a CB trap 2 for attenuating a CB band and is connected to an input end 6a of an input tuning circuit 6 sequentially through an IF trap circuit 3 for attenuating an intermediate frequency band, an FM trap circuit 4 for attenuating an FM broadcasting band, and a coupling capacitance element 5. The IF trap circuit 3 and the FM trap circuit 4 are constituted of a parallel resonance circuit, respectively. A resistor 7 is connected to the coupling capacitor element 5 in parallel. The input tuning circuit 6 is switched by a diode 6b so as to be tuned to a low band or a high band of VHF bands.

On the other hand, a second terminal 11 to which an FM broadcasting signal is input is connected to the input end 6a of the input tuning circuit 6 sequentially through an inductance element 12, a third diode 13 and a second diode 14 serially connected to each other, a first diode 15, and a coupling capacitance element 5. The cathode of the first diode 15 is connected to the cathode of the second diode 14. The anode of the second diode 14 is connected to the anode of the third diode 13. The first diode 15 is provided at the side of the input tuning circuit 6. The third diode 13 is provided at the side of the second input terminal 11. The anode of the fourth diode 16 is connected to the connection point of the IF trap circuit 3 and the FM trap circuit 4. The cathode of the fourth diode is connected to the connection point between the first diode 15 and the second diode 14.

The connection point of the cathodes of the first diode 15, the second diode 14, and the fourth diode 16 is grounded by a first capacitance element 17. The connection point of the anode of the second diode 14 and the anode of the third diode 13 is grounded by a second capacitance element 18. The first and second capacitance elements 17 and 18 constitute a low pass filter together with the inductance element 12 when the second diode 14 and the third diode are switched on. The capacitance values of the first and second capacitance elements are preferably equal to each other.

A voltage dividing circuit 21 for dividing a power supply voltage B by a resistor to thus generate a bias voltage and a transistor 23 whose emitter is grounded and whose collector is pulled up to the power supply voltage B by the feed resistor 22 are provided. The bias voltage from the voltage dividing circuit 21 is applied to the anodes of the first and fourth diodes 15 and 16 through the inductance elements 6c and 6d in the input tuning circuit 6 and is also applied to the anodes of the second and third diodes 14 and 13 through a resistor 24.

The connection point of the cathodes of the first diode 15, the second diode 14, and the fourth diode 16 is connected to the collector of the transistor 23 through a resistor 25. The cathode of the third diode 13 is also connected to the collector of the transistor 23 through a resistor 26.

It is possible to remove the third diode 13. However, in this case, the second capacitance element 18 and the resistor 26 are removed by directly connecting the inductance element 12 to the anode of the second diode 14. The inductance element 12 and the first capacitance element 17 constitute a low pass filter.

In the above-mentioned structure, when the transistor 23 is switched on, the first through fourth diodes 15, 14, 13, and 16 are switched on. Therefore, the FM broadcasting signal input to the second input terminal 11 is input to the input tuning circuit 6 serially through the third diode 13, the second diode 14, the first diode 15, and the coupling capacitance element 5. In this case, since the inductance element 12 and the first and second capacitance elements 17 and 18 constitute a low pass filter, a signal having a frequency higher than that of the FM broadcasting signal is cut off.

In a system where the television signal and the FM broadcasting signal are input to a first input terminal 1, since both ends of the FM trap circuit 4 are short-circuited by the first diode 15 and the fourth diode 16, it is possible to receive the FM broadcasting signal.

On the other hand, when the transistor 23 is switched off, the first through fourth diodes 15, 14, 13, and 16 are switched off. Therefore, only the television signal input to the first input terminal 1 is input to the input tuning circuit 6. In this case, since there are no serially interposed diodes in the line (the signal line between the first input terminal 1 and the input tuning circuit 6) through which the television signal passes, loss caused by diodes is not generated. Therefore, it is possible to improve a basic electric performance such as NF.

The capacitance value between the terminals of the second and third diodes 14 and 13 is much smaller than the capacitance values of the first capacitance element 17 and the second capacitance element 18. Therefore, since the voltage of the FM broadcasting signal input to the second input terminal 11 is divided by the capacitance between the respective terminals and the first and second capacitance elements, the level of the FM broadcasting signal is lowered. Therefore, the level of the FM broadcasting signal that leaks to the line (the signal line between the first input terminal 1 and the input tuning circuit 6) through which the television signal passes is lowered, thus reducing greatly interference due to overlapping the television signal with the FM broadcasting signal.

As apparent from FIG. 1, since the television signal and the FM broadcasting signal are switched by the four diodes and one transistor that controls the diodes, it is possible to reduce the number of peripheral parts as well as the number of active parts to be used and to thus simplify the structure of a circuit.

As mentioned above, according to the present invention, the first input terminal is connected to the input end of the input tuning circuit, first and second diodes are serially connected between the second input terminal and the input end of the input tuning circuit and are simultaneously switched on or off, the first diode is input to the input end of the input tuning circuit, the second diode is provided at the side of the second input terminal, an inductance element is interposed between the second input terminal and the second diode, and a first capacitance element that forms a low pass filter together with the inductance element in a state when the second diode is switched on, is connected between the connection point of the first diode and the second diode and a ground. Therefore, loss caused by the diodes is not generated when the television signal is received, thus improving the basic electric performance such as NF (noise factor). Also, the voltage of the FM broadcasting signal is divided by the inter-terminal capacitance of the first diode and the first capacitance element, thus lowering the level of FM broadcasting signal. Therefore, since the level of the FM broadcasting signal that leaks to the line through which the television signal passes is lowered, it is possible to further reduce interference due to overlapping the television signal with the FM broadcasting signal.

In addition, a third diode that is switched on or off simultaneously with first and second switches is interposed between the inductance element and the second diode, and a second capacitance element that forms a low pass filter together with the inductance element and the first capacitance element in a state when the second and third diodes are switched on, is connected between the connection point of the second diode and the third diode and the ground. Therefore, the voltage of the FM broadcasting signal is further divided, thus lowering the level of the FM broadcasting signal. As a result, it is possible to further reduce interference due to the FM broadcasting signal.

In addition, an FM trap circuit for attenuating an FM broadcasting band is provided between the first input terminal and the input end of the input tuning circuit, a fourth diode is connected between the connection point of the first diode and the second diode and the input end of the FM trap circuit, the fourth diode is switched on or off simultaneously with the first through third diodes.

Therefore, even if the FM broadcasting signal is input from the first input terminal, it is possible to receive the FM broadcasting signal.

Further, a transistor whose emitter is grounded and whose collector is pulled up to a power supply voltage by a feed resistor is provided, the cathodes of the first, second, and fourth diodes are connected to each other, the anodes of the second and third diodes are connected to each other, a bias voltage lower than the power supply voltage is supplied to the anodes of the first through fourth diodes, the cathodes of the first, second, and fourth diodes are connected to the collector of the transistor through a common first resistor, the cathode of the third diode is connected to the collector of the transistor through a second resistor, and the transistor is switched on or off. Therefore, it is possible to simply control the switching on or off of the first through fourth diodes. Also, since it is possible to switch between the television signal and the FM broadcasting signal by changing the active element, it is possible to simplify the structure of a circuit.

What is claimed is:

1. An input circuit of a television tuner, comprising:
a first input terminal to which a television signal is input;
a second input terminal to which an FM broadcasting signal is input;
an input tuning circuit tuned to the television signal and the FM broadcasting signal,
wherein the first input terminal is connected to an input end of the input tuning circuit; first and second diodes serially connected between the second input terminal and the input end of the input tuning circuit and simultaneously switched on or off,
wherein the first diode is input to the input end of the input tuning circuit, and
wherein the second diode is provided at a side of the second input terminal;
an inductance element interposed between the second input terminal and the second diode;
a first capacitance element that forms a low pass filter together with the inductance element when the second diode is switched on and is connected between a connection point of the first diode and the second diode and a ground;
an FM trap circuit provided between the first input terminal and the input end of the input tuning circuit for attenuating an FM broadcasting band; and
a fourth diode connected between the connection point of the first diode and the second diode and an input end of the FM trap circuit, wherein the fourth diode is switched on or off simultaneously with the first, second, and third diodes.

2. The input circuit of the television tuner according to claim 1, further comprising
  a third diode that is switched on or off simultaneously with first and second switches and is interposed between the inductance element and the second diode; and
  a second capacitance element that forms a low pass filter together with the inductance element and the first capacitance element when the second and third diodes are switched on and is connected between a connection point of the second diode and the third diode and the ground.

3. The input circuit of the television tuner according to claim 1, further comprising a transistor whose emitter is grounded and whose collector is pulled up to a power supply voltage by a feed resistor, wherein cathodes of the first, second, and fourth diodes are connected to each other, wherein anodes of the, second, and third diodes are connected to each other, wherein a bias voltage lower than the power supply voltage is supplied to the anodes of the first, second, third and fourth diodes, wherein the cathodes of the first, second, and fourth diodes are connected to the collector of the transistor through a common first resistor, wherein a cathode of the third diode is connected to the collector of the transistor through a second resistor, and wherein the transistor is switched on or off.

* * * * *

UNITED STATES PATENT AND TRADEMARK OFFICE
CERTIFICATE OF CORRECTION

| | |
|---|---|
| PATENT NO. | : 7,190,414 B2 |
| APPLICATION NO. | : 10/811698 |
| DATED | : March 13, 2007 |
| INVENTOR(S) | : Masaki Yamamoto |

It is certified that error appears in the above-identified patent and that said Letters Patent is hereby corrected as shown below:

On the Title Page

Item -57-, delete lines 1-22 under "ABSTRACT" and substitute --In an FM/TV receiver, a first input terminal is connected to an input end of an input tuning circuit, first and second diodes are serially connected between a second input terminal and the input end of the input tuning circuit and are simultaneously switched on or off, the first diode is input to the input end of the input tuning circuit, the second diode is provided at the side of the second input terminal, an inductance element is interposed between the second input terminal and the second diode, and a first capacitance element that forms a low pass filter together with the inductance element in a state when the second diode is switched on, is connected between the connection point of the first diode and the second diode and a ground.-- in its place.

Signed and Sealed this

Twelfth Day of June, 2007

JON W. DUDAS
*Director of the United States Patent and Trademark Office*